US012696804B2

(12) United States Patent
Ecton et al.

(10) Patent No.: US 12,696,804 B2
(45) Date of Patent: Jul. 28, 2026

(54) MULTICHIP IC DEVICES WITH DIE EMBEDDED IN GLASS SUBSTRATE AND A REDISTRIBUTION LAYER INTERCONNECT BRIDGE

(71) Applicant: Intel Corporation, Santa Clara, CA (US)

(72) Inventors: Jeremy Ecton, Gilbert, AZ (US); Brandon Marin, Gilbert, AZ (US); Srinivas Pietambaram, Chandler, AZ (US); Gang Duan, Chandler, AZ (US); Suddhasattwa Nad, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 6 days.

(21) Appl. No.: 17/956,363

(22) Filed: Sep. 29, 2022

(65) Prior Publication Data

US 2024/0113075 A1 Apr. 4, 2024

(51) Int. Cl.
*H10W 90/00* (2026.01)
*H10W 70/60* (2026.01)
(Continued)

(52) U.S. Cl.
CPC .......... *H10W 90/00* (2026.01); *H10W 70/611* (2026.01); *H10W 70/614* (2026.01);
(Continued)

(58) Field of Classification Search
CPC . H01L 25/0655; H01L 21/52; H01L 23/5383; H01L 23/5384; H01L 23/5389;
(Continued)

(56) References Cited

U.S. PATENT DOCUMENTS

| | | | |
|---|---|---|---|
| 6,787,895 B1 * | 9/2004 | Jarcy | H01L 23/3677 |
| | | | 361/764 |
| 8,411,459 B2 * | 4/2013 | Yu | H01L 23/49827 |
| | | | 361/783 |

(Continued)

FOREIGN PATENT DOCUMENTS

CN 109346414 2/2019

OTHER PUBLICATIONS

Extended European Search Report from European Patent Application No. 17/956,363 notified Mar. 28, 2024, 8 pgs.

*Primary Examiner* — Vu A Vu
(74) *Attorney, Agent, or Firm* — Essential Patents Group, LLP

(57) ABSTRACT

Multi-die packages including a glass substrate within a space between adjacent IC dies. Two or more IC die may be placed within recesses formed in a glass substrate. The IC die and glass substrate, along with any conductive vias extending through the glass substrate may be planarized. Organic package dielectric material may then be built up on both sides of the IC dies and glass substrate. Metallization features formed within package dielectric material built up on a first side of the IC die may electrically interconnect the IC dies to package interconnect interfaces that may be further coupled to a host with solder interconnects. Metallization features formed within package dielectric material built up on a second side of the first and second IC dies may electrically interconnect the first IC die to the second IC die.

19 Claims, 7 Drawing Sheets

(51) Int. Cl.
  *H10W 70/63*      (2026.01)
  *H10W 70/685*    (2026.01)
  *H10W 72/00*     (2026.01)

(52) U.S. Cl.
  CPC ....... *H10W 70/635* (2026.01); *H10W 70/685*
        (2026.01); *H10W 72/071* (2026.01)

(58) Field of Classification Search
  CPC ... H01L 23/49816; H01L 23/15; H01L 24/19;
        H01L 24/20
  USPC ........................................................ 257/668
  See application file for complete search history.

(56)             References Cited

U.S. PATENT DOCUMENTS

| | | | |
|---|---|---|---|
| 8,829,672 B2 * | 9/2014 | Chen ..................... | H01L 21/561 |
| | | | 257/737 |
| 9,155,191 B2 * | 10/2015 | Kim ..................... | H05K 1/0271 |
| 9,322,901 B2 * | 4/2016 | Kerness .................. | G01S 17/04 |
| 11,270,920 B2 * | 3/2022 | Kim ......................... | H01L 24/14 |
| 2014/0070405 A1 * | 3/2014 | Agarwal ............. | H01L 23/3121 |
| | | | 257/737 |
| 2017/0207160 A1 | 7/2017 | Gowda et al. | |
| 2020/0058567 A1 | 2/2020 | Kim et al. | |
| 2020/0312767 A1 * | 10/2020 | Pietambaram ........ | H01L 23/481 |
| 2021/0134711 A1 | 5/2021 | Fang | |
| 2022/0102310 A1 | 3/2022 | Sato et al. | |

* cited by examiner

101

Receive Workpiece Including a Glass
Substrate
110

Form Cavity In Substrate
120

Place IC Die Into Cavity & Planarize
130

Form Package Dielectric(s) and RDL Features
Bridging Multiple IC Die
140

Complete Package
150

MULTICHIP IC DEVICES WITH DIE EMBEDDED IN GLASS SUBSTRATE AND A REDISTRIBUTION LAYER INTERCONNECT BRIDGE

BACKGROUND

Monolithic integrated circuit (IC) fabrication has restrictions that may limit a final product's performance, and thus different versions of IC die disaggregation are being investigated. To date however, these techniques and architectures generally suffer from certain drawbacks such as high cost, lower insertion efficiency, and increased z-height.

In electronics manufacturing, IC packaging is a stage of semiconductor device fabrication in which an IC that has been monolithically fabricated on a chip (or die) comprising a semiconducting material is assembled into a "package" that can protect the IC chip from physical damage and support electrical contacts that connect the IC to a scaled host component, such as an organic package substrate, or a printed circuit board. Multiple chips can be similarly assembled, for example, into a multi-chip package (MCP).

The electrical interconnection between multiple IC dies is important to ensure device performance is sufficient as die-to-die communication demands can be significantly higher than die-to-host demands Die-to-die interconnection may be achieved with an embedded die that hosts the interconnect routing. One motivation behind such as solution is that organic dielectric material employed within most packages suffers from high total thickness variation (TTV) and, thus, necessitates a large depth of focus (DOF), which ultimately limits the resolution of lithography employed to defined interconnect features within a package.

Alternative architectures that reduce TTV of package structures may be commercially advantageous as enabling alternative forms of die-to-die interconnection.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION OF EXEMPLARY EMBODIMENTS

Figure 1:
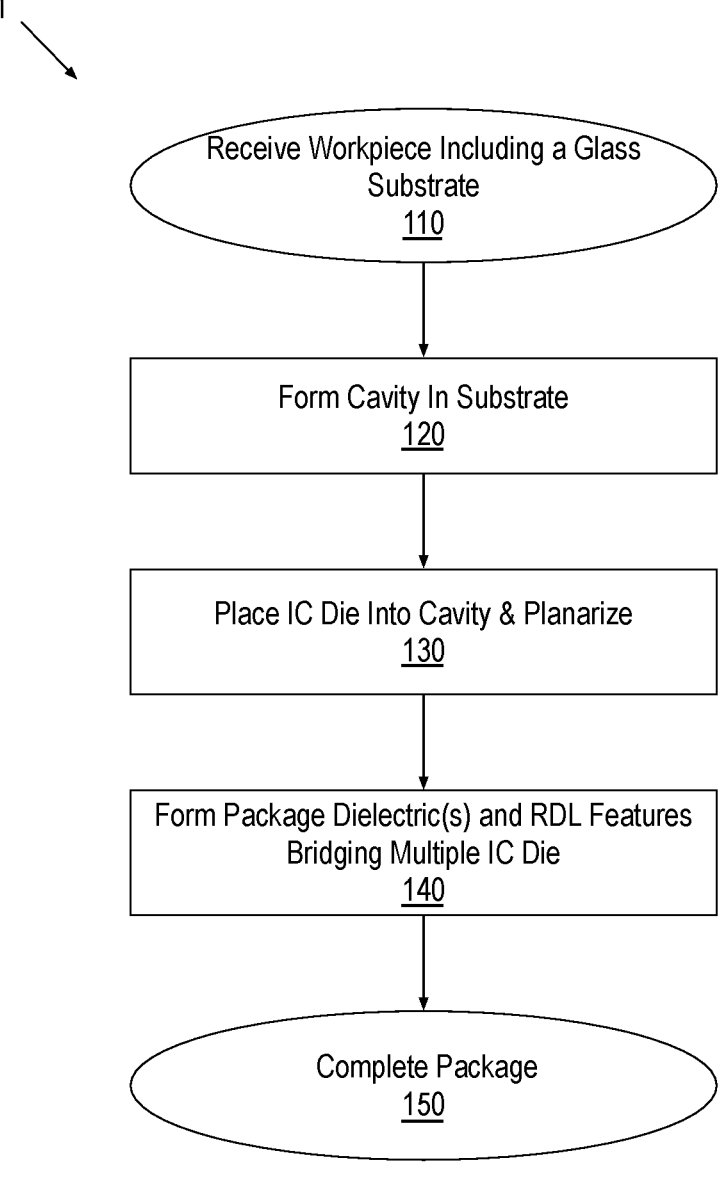
FIG. 1 illustrates a flow diagram of methods for forming a multi-chip device structure including a glass substrate with IC die redistribution and interconnection layers, in accordance with some embodiments.

Embodiments are described with reference to the enclosed figures. While specific configurations and arrangements are depicted and discussed in detail, this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. These terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause-and-effect relationship).

The terms "over," "under," "between," and "on" as used herein refer to a relative position of one component or material with respect to other components or materials where such physical relationships are noteworthy. For example, in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct contact with that second material/layer. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Unless otherwise specified in the specific context of use, the term "predominantly" means more than 50%, or more than half. For example, a composition that is predominantly a first constituent means more than half of the composition is the first constituent (e.g., <50 at. %). The term "primarily" means the most, or greatest, part. For example, a composition that is primarily a first constituent means the composition has more of the first constituent than any other constituent. A composition that is primarily first and second constituents means the composition has more of the first and second constituents than any other constituent. The term "substantially" means there is only incidental variation. For example, composition that is substantially a first constituent means the composition may further include <1% of any other constituent. A composition that is substantially first and second constituents means the composition may further include <1% of any constituent substituted for either the first or second constituent.

Multi-chip device structures including multiple IC dies embedded in a glass substrate are described herein. Redistribution layer (RDL) metallization on a first side of the glass substrate may interconnect one or more of the IC dies to a device host component (e.g., through solder features) while redistribution layer metallization on a second side of the glass substrate may interconnect a first of the IC dies to a second of the IC dies. The die bridging interconnects may be finely patterned (e.g., to less than 3 μm lines and spaces) as the glass substrate has flatness and/or thickness control superior to organic substrates.

Multi-chip device structures may be fabricated according to a "die first" approach with the IC dies first embedded within a cavity of a glass substrate. Following planarization, organic packaging dielectric(s) may then be deposited, patterned and plated with metallization to directly form IC die and substrate connections. Different fabrication methods may be practiced to form multi-chip device structures having one or more of the features or attributes described herein. FIG. 1 illustrates a flow diagram of methods 101 for forming a multi-chip device structure including a glass substrate with directly patterned die bridging redistribution layer metallization, in accordance with some embodiments.

Methods 101 begin at input 110 with the receipt of a glass substrate that has been fabricated upstream of methods 101. The glass substrate comprises a glass medium, which in some examples is a core of a substrate that may have one or more films on the core. The glass medium advantageously has a flatness comparable to that of silicon wafers, and may have large dimensions suitable for large format panel processing, etc. The glass substrate may be supported by a carrier or handle substrate, such as any of those known to be suitable in the industry.

Figure 2:
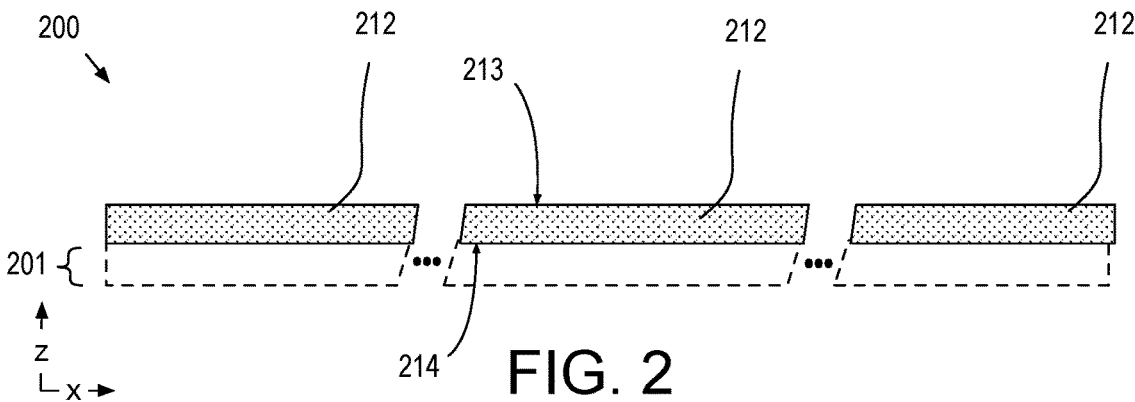
FIGS. 2 and 3A illustrate cross-sectional views of a workpiece with a plurality of multi-chip devices evolving as operations in the methods illustrated in FIG. 1 are practiced, in accordance with some embodiments.

In the example illustrated in FIG. 2, a workpiece 200 comprises a glass substrate 212 adhered, or otherwise affixed, to a carrier 201. Glass substrate 212 may consist of only glass, or it may have one or more thin film material layers on one or both of a front side or back side of the glass medium. Glass substrate 212 is advantageously predominantly silica (e.g., silicon and oxygen). Any dopants (e.g., boron, phosphorus) may be present in glass substrate 212 glass (e.g., borosilicate glass, etc.) as embodiments herein are not limited in this respect.

Although not depicted, one or more material may clad either or both of the top side 213 or bottom side 214 of glass substrate 212. Exemplary core cladding materials include silicon nitride ($SiN_x$) or silicon oxynitride ($SiO_xN_y$). In other embodiments, a silicon layer (polycrystalline or monocrystalline) may clad one or both sides of a glass medium as part of glass substrate 212.

Returning to FIG. 1, methods 101 continue at block 120 where one or more cavities are formed in the glass substrate. Each cavity is to host one or more IC dies and is dimensioned accordingly. The glass medium may be patterned at block 120 according to any methods known to be suitable for the material. Alternatively, the glass medium received at input 110 is a preform that already includes cavities fabricated upstream of methods 101.

In some embodiments, each cavity is mechanically milled into the glass. In other embodiments, each cavity is formed with a laser, for example through the ablation of glass or some modification of the glass that renders it susceptible to etch. In still other embodiments, each cavity is formed with a masked etch process, which may either comprise a dry plasma or wet chemical etch.

Figure 3A:
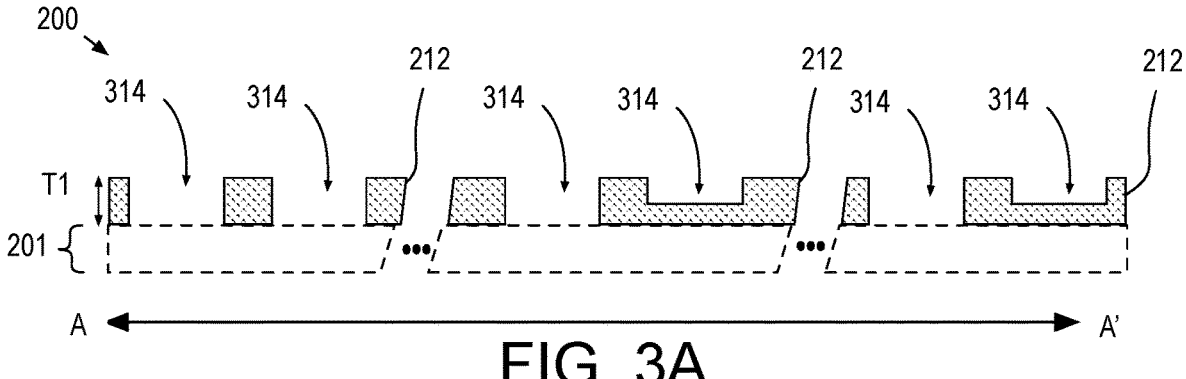
Figure 3B:
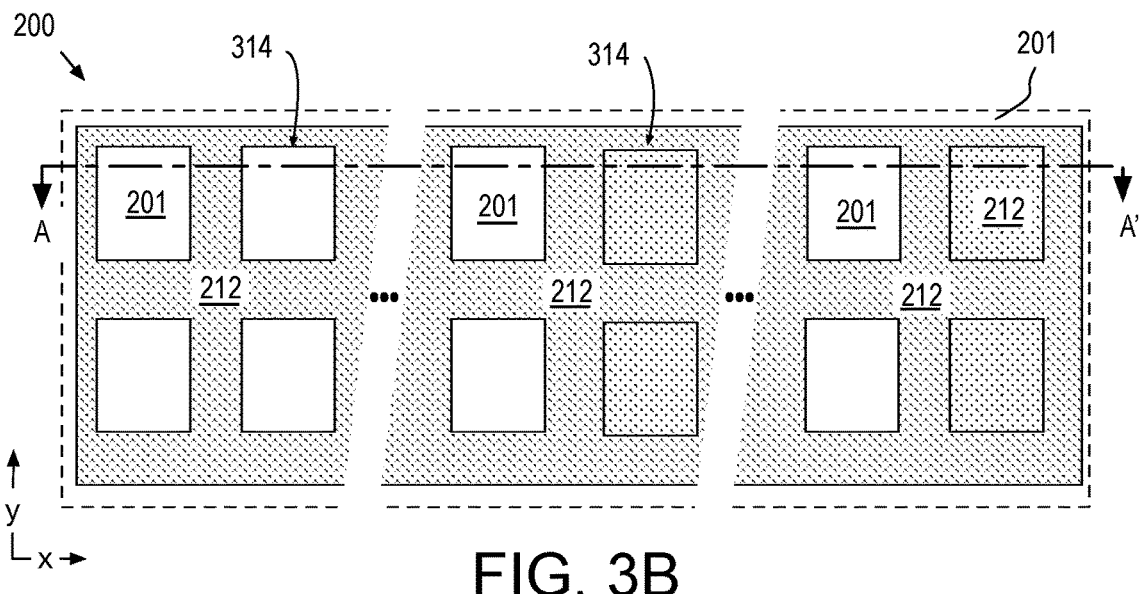
FIG. 3B illustrates a plan view of the workpiece illustrated in FIG. 3A, in accordance with some embodiments.

Cavities within the glass substrate may extend through an entire thickness of the glass medium (i.e., through holes) or may extend through only a partial thickness of the glass medium (i.e., a recessed surface). In the examples further illustrated in FIG. 3A, some cavities 314 extend from substrate top surface 213 through an entire thickness T1 of glass substrate 212 to expose carrier 201. While other cavities 314 are illustrated as being recessed into top surface 213 to a depth less than substrate thickness T1 so that no portion of carrier 201 is exposed by the cavity. Such variations between cavities may not be implemented within a single workpiece, but are nevertheless so illustrated in FIG. 3A for the sake of clarity. FIG. 3B further illustrates a plan view showing a footprint of cavities 314 arrayed over an area of glass substrate 212.

Returning to FIG. 1, methods 101 continue at block 130 where one or more IC dies is placed within a cavity. Hence, the IC dies are embedded within the cavities in the glass medium rather than merely attached to a planar frontside or backside surface of a glass medium. Accordingly, a sidewall edge of the IC die is adjacent to a sidewall edge of the glass medium. In some examples, at block 130 a pick-and-place machine positions IC dies within glass medium cavities. Any permanent or temporary adhesive or bond film known to be suitable for die attach (e.g., a thermoset) may be employed to hold an IC die within a cavity during subsequent processing.

As the dimensions of the cavity are larger than those of the IC die to accommodate placement error, a gap between a sidewall of the glass medium and a sidewall of the IC die may be filled with any suitable filler, such as a dielectric material. The filler may be a mold compound, for example. The filler may also be another organic dielectric material, for example applied wet and cured, or applied as a dry film. Exposed surfaces of the assembly may then be planarized, for example with a grind or polish process suitable for the composition of the IC die and glass medium.

Figure 4A:
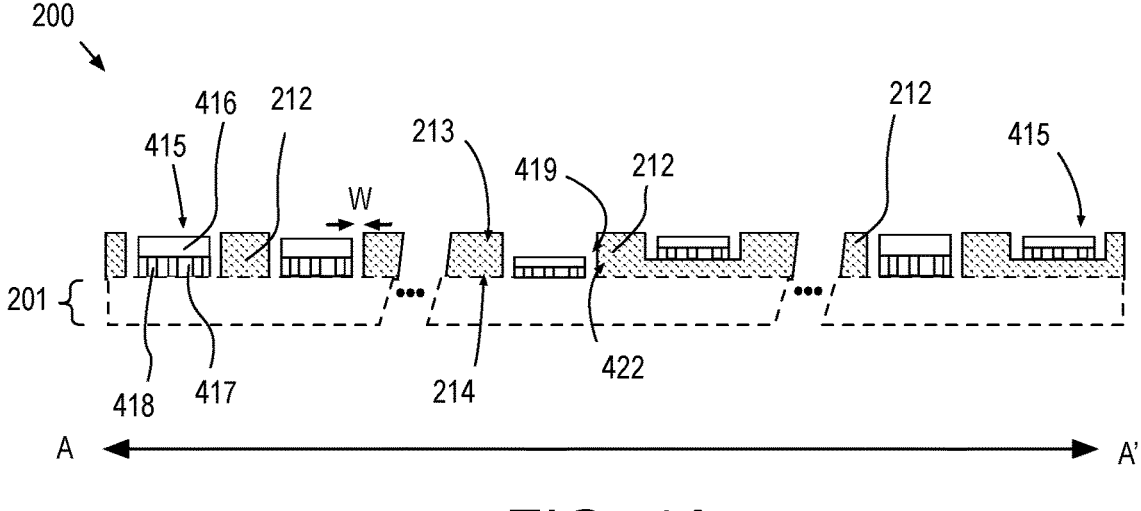
FIG. 4A illustrates a cross-section view of the workpiece evolving as operations in the methods illustrated in FIG. 1 are practiced, in accordance with some embodiments.

In the example illustrated in FIG. 4A, an IC die 415 is located within each cavity 314 and therefore embedded within glass substrate 212. A bond film (not depicted) may be between IC die 415 and a bottom of cavity 314 (glass substrate 212 or carrier 201). A number of different thick die and thin die examples are illustrated in FIG. 4A. As shown, a thin die may be placed in a recess of lesser depth than thick die. Alternatively, instead of accommodating IC die of different thickness with cavities of differing depths, all cavities may instead be sufficient (e.g., a full thickness of glass medium) to accommodate a thickest IC die and glass substrate top surface 213 will stand proud of surfaces of IC dies 415 by varying amounts. In the examples illustrated in FIG. 4A, all IC dies 415 have a thickness less than substrate thickness T1 or less than a depth of their corresponding cavity 314 so that substrate top surface 213 stands proud of IC dies 415 by at least some non-zero amount. However, particularly if the IC die is instead flip-chip assembled into the cavities, the IC die may stand proud of glass substrate 212 and be subsequently planarized.

Figure 4B:
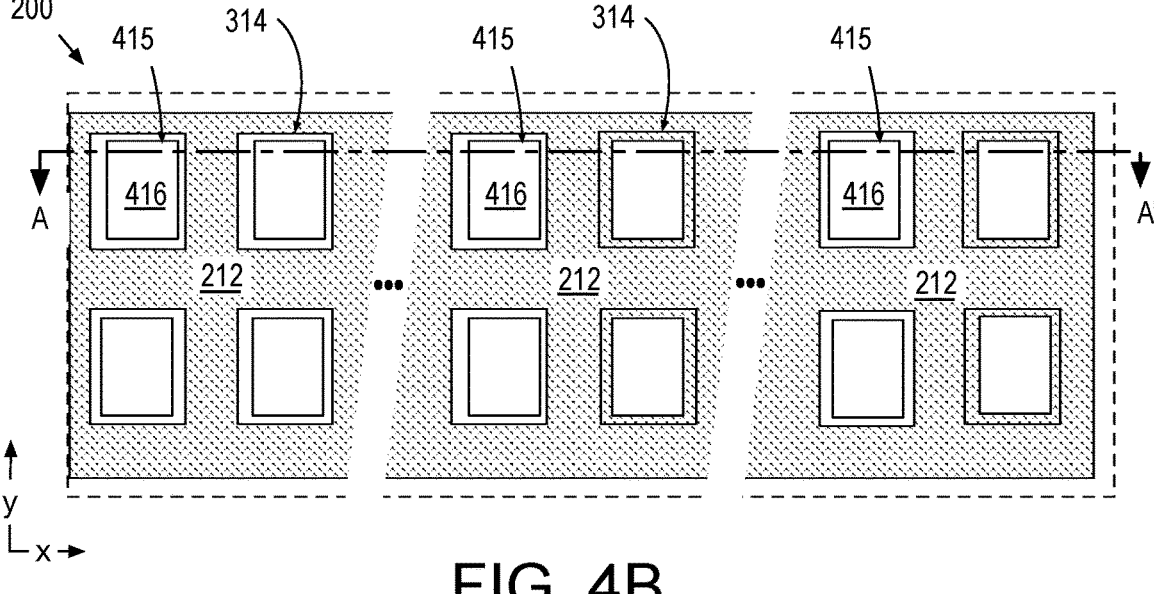
FIG. 4B illustrates a plan view of the workpiece illustrated in FIG. 4A, in accordance with some embodiments.

Glass substrate 212, as illustrated in an x-y plane in FIG. 4B, may surround each IC die 415, for example forming a perimeter about the edges of one IC die 415. Alternatively, more than one IC die 415 may be located within a single cavity 314. In the examples shown in FIGS. 4A and 4B, IC die 415 have been placed within cavities 314 so a die edge sidewall 419 is laterally adjacent to a sidewall 422 of glass substrate 212. A gap of width W is between die edge sidewall 419 and glass medium sidewall 422. Gap width W may vary, for example from 100 nm to several microns. IC die 415 may be assembled to carrier 201 "front-side up," so that IC layers 416 are distal from carrier 201, as shown in FIG. 4A. However, in alternative embodiments, IC die 415 may be flip-chip assembled "front-side down" so that IC layers 416 are instead proximal to carrier 201.

IC die 415 may have any architecture. In the example illustrated in FIG. 4A, IC die 415 has IC layers 416 on a front side of IC die 415 and further comprises an IC die substrate material 417 on a back side of IC die 415. In some examples, IC die substrate material 417 is silicon. In other examples, IC die substrate material 417 is an alternative crystalline material, such as, but not limited to, germanium, $Si_xGe_{1-x}$, $Ge_xSn_{1-x}$, or silicon carbide.

In the illustrated embodiments, IC die 415 is an "active" IC die with one or more types of active devices within IC die layers 416. Such active devices may be fabricated into a surface of IC die substrate material 417, or not (e.g., instead part of a transferred substrate). IC layers 416 may include any semiconductor material such as, but not limited to, predominantly silicon (e.g., substantially pure Si) material, predominantly germanium (e.g., substantially pure Ge) material, or a compound material comprising a Group IV majority constituent (e.g., SiGe alloys, GeSn alloys). In other embodiments, IC layers 416 include a Group III-V material comprising a Group III majority constituent and a Group IV majority constituent (e.g., InGaAs, GaAs, GaSb, InGaSb). IC layers 416 may have a thickness of 50-1000 nm, for example. IC die layers 416 need not be continuous layers, but rather may include active regions of semiconductor material surrounded by field regions of isolation dielectric.

In some embodiments, the active devices within IC layers 416 are field effect transistors (FETs) with a device pitch of 80 nm, or less. The FETs may be of any architecture (e.g., planar, non-planar, single-gate, multi-gate, stacked nanosheet, etc.). In some embodiments, FET terminals have a feature pitch of 20-40 nm. Additionally, or in the alternative, IC layers 416 may include active devices other than FETs. For example, IC layers 416 may include electronic memory structures, such as magnetic tunnel junctions (MTJs), capacitors, or the like.

In alternative embodiments, one or more IC die 415 is a "passive" die and lacks an FETs fabricated within IC layer 416. Such passive die may merely include interconnect routing level, for example resulting from any backend of line monolithic die fabrication process. Regardless of whether IC die 415 is active or passive, IC layers 416 may include passive devices such as resistors, capacitors, or inductors (not depicted).

IC die 415 may comprise one or more IC die metallization levels on either side of IC die 415. In exemplary embodiments, IC layers 416 include metallization features embedded within an insulator. While the IC die metallization features may have any composition(s) of sufficient electrical conductivity, in exemplary embodiments, the IC die metallization features are predominantly copper (Cu). In other examples, the metallization features are predominantly other than Cu, such as, but not limited to predominantly Ru, or predominantly W. An uppermost one of the metallization features within IC layers 416 may have a feature pitch ranging from 100 nm to several microns, for example.

In the illustrated example, IC die 415 further includes one or more through die substrate vias (TSVs) 418 extending from die backside surface 214 through IC die substrate material 417. IC die TSVs 418 couple with IC layer 416, for example contacting one or more metallization features and/or terminals of active or passive devices. IC die TSVs 418 may have any architecture and generally include a metallization, such as, but not limited to, Cu.

Each of IC dies 415 may therefore be a fully functional ASIC, or may be a chiplet or tile that has more limited functionality supplementing the function of one or more other IC dies that are to be part of the same multi-chip device. A chiplet or tile may, for example, be any of a wireless radio circuit, microprocessor core, electronic memory circuit, floating point gate array (FPGA), power management and/or power supply circuit, or include a MEMS device. In some examples, one or more of IC dies 415 include one or more banks of active repeater circuitry to improve multi-chip interconnects (e.g., network-on-chip architectures). In other examples, one or more of IC dies 415 includes clock generator circuitry or temperature sensing circuitry. In other examples, one or more of IC dies 415 include logic circuitry that, along with other IC dies 415 implement 3D logic circuitry (e.g., mesh network-on-chip architectures). In still other examples, at least one of IC dies 415 includes microprocessor core circuitry, for example comprising one or more shift registers. In another example, at least one of IC dies 415 is a photonic IC (PIC), for example comprising one or more optical waveguides, optical multiplexer/demultiplexer, lasers and/or photodetectors.

For some such embodiments, the glass substrate 212 conveys optical signals to/from one or more of IC dies 415.

Figure 5:
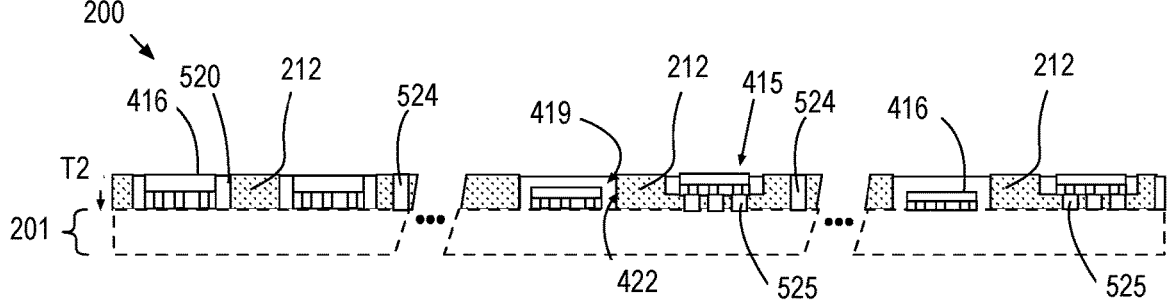
FIGS. 5, 6 and 7A illustrate cross-sectional views of a workpiece with a plurality of multi-chip devices evolving as operations in the methods illustrated in FIG. 1 are practiced, in accordance with some embodiments.

FIG. 5 further illustrates workpiece 200 after application of a filler 520 followed by planarization of the front-side surface of workpiece 200. As shown, filler 520 may be retained within the gap between die edge sidewall 419 and glass medium sidewall 422 while any overburden may be removed during planarization. An amount of filler 520 may also be retained over a surface of thin IC die that are recessed well below glass substrate 212.

For the illustrated embodiment where IC die 415 are "front-side up," planarization may stop upon exposing an uppermost one of IC die layers 416. For alternative embodiments where IC die 415 are "front-side down," planarization may remove any amount of IC die substrate 417 desired, for example to planarize IC die of different thickness, etc. The planarization process may also reduce the thickness of glass-substrate 212 to a final thickness T2 that is substantially equal to a thickness of at least one of the IC dies 415.

Filler 520 may have any composition and may be applied to workpiece 200 according to any technique suitable for the material. Filler 520 is advantageously an electrical insulator. In some examples, filler 520 is an organic dielectric, for example comprising an epoxy or polyimide. The organic dielectric may be applied, for example, with a molding process. In other embodiments, filler 520 is an inorganic dielectric material and may have composition known to be suitable as an insulator of monolithic integrated circuitry, such as, but not limited to, silicon dioxide, silicon nitride, silicon oxynitride, or a low-k material having a relative permittivity below 3.5. Inorganic dielectric materials may be deposited with any techniques known to be suitable, such as, but not limited to chemical vapor deposition (CVD).

Optionally, as further illustrated in FIG. 5, any number of electrically conductive through-glass vias (TGVs) 524 may extend through the entire glass medium thickness T2. TGVs 524 may have any architecture and generally include a metallization, such as, but not limited to, Cu. TGVs 524 may be fabricated as part of methods 101 (FIG. 1) or may be prefabricated in the glass-substrate received as an input to methods 101. Regardless, TGVs 524 may be formed, for example, with a milling, ablation, or etching process similar to any that may be enlisted to form the IC die cavities within glass substrate 212. Metallization may be then deposited in the through via openings, for example with a plating process.

For embodiments where a thin IC die 415 is recessed within a cavity that does not extend through the glass-substrate thickness T2, additional TGVs 525 may extend through any partial thickness of glass-substrate 212 to reveal interconnect features on the thin IC die 415. TGVs 525 may also have any architecture and generally include a metallization, such as, but not limited to, Cu. TGVs 525 may also be fabricated as part of methods 101 (FIG. 1) or may be prefabricated in the glass-substrate received as an input to methods 101. TGVs 525 may be formed, for example, with a milling, ablation, or etching process similar to any that may be enlisted to form the IC die cavities within glass substrate 212. Metallization may be then deposited in the through via openings, for example with a plating process.

Returning to FIG. 1, methods 101 continue at block 140 where package dielectric(s) and redistribution layer (RDL) features are formed on one or more sides of the work piece. In exemplary embodiments, at block 140 RDL features are formed on both a front side and a back side of the glass substrate. Such RDL features may be built-up on front and back sides of the glass substrate concurrently if the carrier is first removed. Alternatively, first RDL features may be built up on a first (e.g., front) side while the carrier is retained on the second side, and second RDL features built up on the second side after the carrier is removed. When the carrier is removed, an additional (e.g., backside) planarization process may be performed for embodiments where removal of the carrier does not also expose the IC dies. For example, where the IC die cavities do not extend through the entire thickness of the glass-substrate, a portion of the glass-substrate underlying the IC die may be removed with a planarization process (e.g., grind or polish) to expose a second side of the IC die. In other examples, even where the IC die cavities do extend through the entire thickness of the glass-section substrate, a back side of the glass substrate may be planarized along with any bond/adhesion material that adhered the IC die within the glass cavity.

In exemplary embodiments, the RDL features formed at block 140 comprise metallization features interconnecting multiple IC dies to each other. These RDL features are therefore to electrically bridge together two or more IC dies, preferably with the finest metallization line:space feature pitch that can be directly patterned (e.g., <3 μm lines and spaces), as limited by the flatness of the workpiece. This first routing structure may be formed on a first side of the glass-substrate. The RDL features formed at block 140 may further comprises metallization features interconnecting multiple IC dies to first-level package interconnect interfaces. This second routing structure may be formed on a second side of the glass-substrate. The number of layers and/or thicknesses of RDL metallization may be the same on both sides of the glass-substrate, or asymmetric with a greater number of metallization layers and/or thicknesses on either the bridging interconnect side or host interconnect side.

Figure 6:
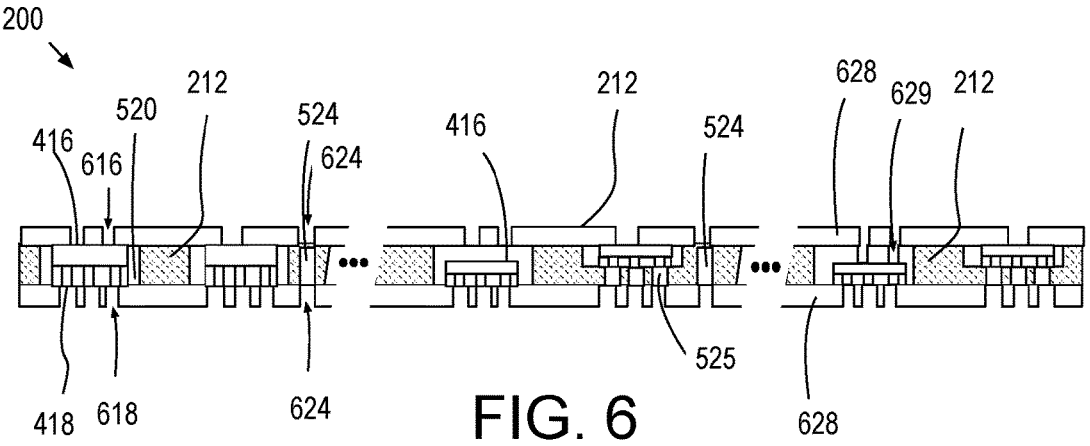

In the example shown in FIG. 6, carrier 201 has been removed workpiece 200 and a first package dielectric 628 formed in contact with both front and back sides of the IC dies 415 and in contact with both front and back sides of glass-substrate 212. As also illustrated in FIG. 6, connections to a thin IC die 415 covered by filler 520 can be revealed as needed with via openings 629 that may be formed with any suitable patterning technique (e.g., laser ablation, dry etch, and/or lithographic patterning)

In exemplary embodiments, package dielectric 628 is an organic material, such as, an epoxy resin, phenolic-glass, or a resinous film such as the GX-series films commercially available from Ajinomoto Fine-Techno Co., Inc. (ABF). Package dielectric 628 may comprise epoxy resins (e.g., an acrylate of novolac such as epoxy phenol novolacs (EPN) or epoxy cresol novolacs (ECN)). In some specific examples, package dielectric 628 is a bisphenol-A epoxy resin, for example including epichlorohydrin. In other examples, package dielectric 628 includes bisphenol-F epoxy resin (with epichlorohydrin). In other examples, package dielectric 628 includes aliphatic epoxy resin, which may be monofunctional (e.g., dodecanol glycidyl ether), difunctional (butanediol diglycidyl ether), or have higher functionality (e.g., trimethylolpropane triglycidyl ether). In still other examples, package dielectric 628 includes glycidylamine epoxy resin, such as triglycidyl-p-aminophenol (functionality 3) and N,N,N',N'-tetraglycidyl-bis-(4-aminophenyl)-methane (functionality 4). Depending on the embodiment, package dielectric 628 may be any of a molding compound, a spin-on material, or dry film laminate material, for example. Package dielectric 628 may be introduced wet/uncured into a cast and then dried/cured. Alternatively, package dielectric 628 may be introduced as a semi-cured dry film that is fully cured followings its application to workpiece 200.

As further illustrated in FIG. 6, openings 616 may be formed through package dielectric 628 to expose metallization features of an uppermost one of metallization layer within device layers 416. On the other side of workpiece 200, other openings 618 have likewise been formed into package dielectric 628 to similarly expose TSVs 418. Additional openings 624 may be formed through package dielectric 628 within a fan-out region adjacent IC dies 415, for example exposing front and back sides of TGVs 524. Any technique suitable for the particular composition of package dielectric 628 may be employed to form openings 616, 618 and 624. For embodiments where package dielectric 628 is photosensitive, a lithographic process may directly pattern package dielectric 628. Alternatively, a photolithographic masking process may be performed and package dielectric 628 etched according to the mask. In other embodiments, openings 616, 618 and 624 may be ablated, for example with a laser.

Figure 7A:
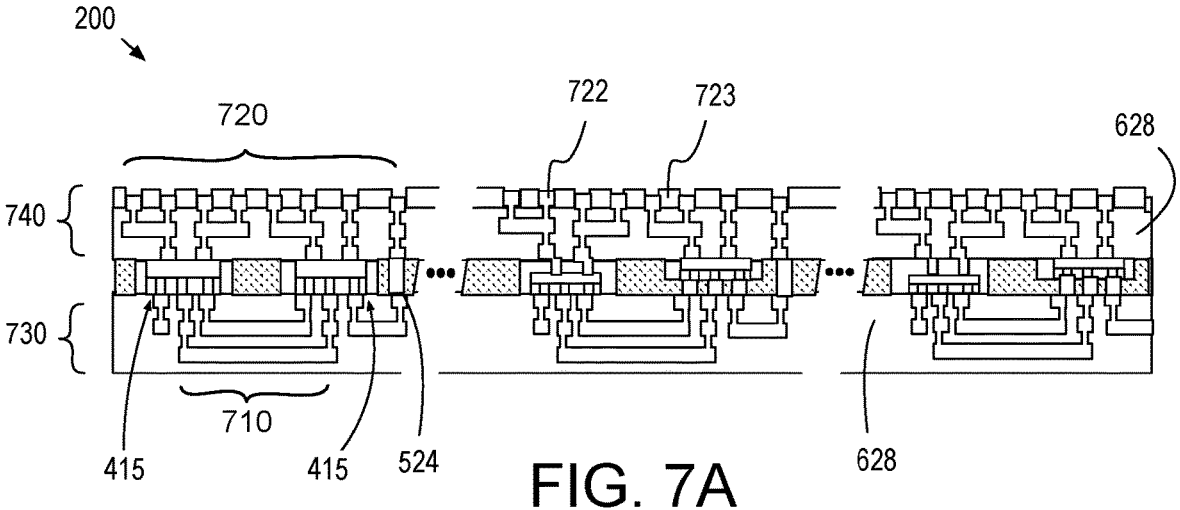

FIG. 7A further illustrates a package routing structure 730 interconnecting two or more adjacent IC dies 415 following the formation of conductive RDL metallization features 710 that backfill openings in one or more layers of package dielectric 628. There may be any number of RDL metallization features 710 built up on a first side of workpiece 200. In the embodiment illustrated, RDL metallization features 710 are on a backside of IC dies 415 so that electrical interconnection between adjacent dies relies on IC die TSVs 418. In alternative embodiments, RDL metallization features 710 are on a frontside of IC dies 415. Although only two IC dies 415 are shown to be interconnected by RDL metallization features 710, any number of IC dies 415 that are to be within a same multi-chip device may be similarly interconnected by RDL metallization features 710.

FIG. 7A further illustrates another package routing structure 740 built-up on an opposite side of workpiece 200. Package routing structure 740 comprises RDL metallization features 720 that similarly backfill openings in one or more layers of package dielectric 628. There may be any number of RDL metallization features 720 built up on a second (e.g., front) side of workpiece 200. In exemplary embodiments where package routing structures 730 and 740 are concurrently built up, RDL metallization features 720 have the same number of metallization levels as metallization features 710. In the embodiment illustrated, RDL metallization features 720 are on a frontside of IC dies 415 and terminate with first-level interconnect interfaces 722. In alternative embodiments, RDL metallization features 720 are on a backside of IC dies 415 and rely on die TSVs. In the example illustrated interconnect interfaces 722 are pillars or pads surrounded by a solder resist 723. Hence, in accordance with the illustrated embodiment RDL metallization features 710 interconnect multiple IC dies 415 together while RDL metallization features 720 fan-out interconnections of the multiple IC dies 415 for further coupling with an external host (not depicted).

As shown in FIG. 7A, routing structure 730 may be directly coupled with routing structure 740 through one or more TGVs 524. Hence, one or more metallization features 710 may be directly coupled to one or more metallization features 720. Accordingly, interconnection between IC dies 415 need not be exclusively through one side of IC dies 415. Likewise, power delivery and/or external interfaces to IC dies 415 need not be exclusively through one side of IC dies 415.

Conductive RDL metallization features 710 and 720 may be formed with an additive or semi-additive process, for example. In some embodiments, each layer of RDL metallization features 710 and 720 are formed by first depositing a seed layer (e.g., Cu) and then forming a plating resist mask (not depicted) over the seed layer. With an electrolytic deposition process, Cu is plated upon the seed layer wherever the resist mask is absent. Accordingly, RDL metallization features 710 and 720 may have substantially the same composition (e.g., predominantly Cu). The building up of RDL metallization features 710 and 720 may comprise any number of cycles with each cycle including package dielectric application, patterning of the package dielectric, and plating of conductive features upon the patterned package dielectric.

Figure 7B:
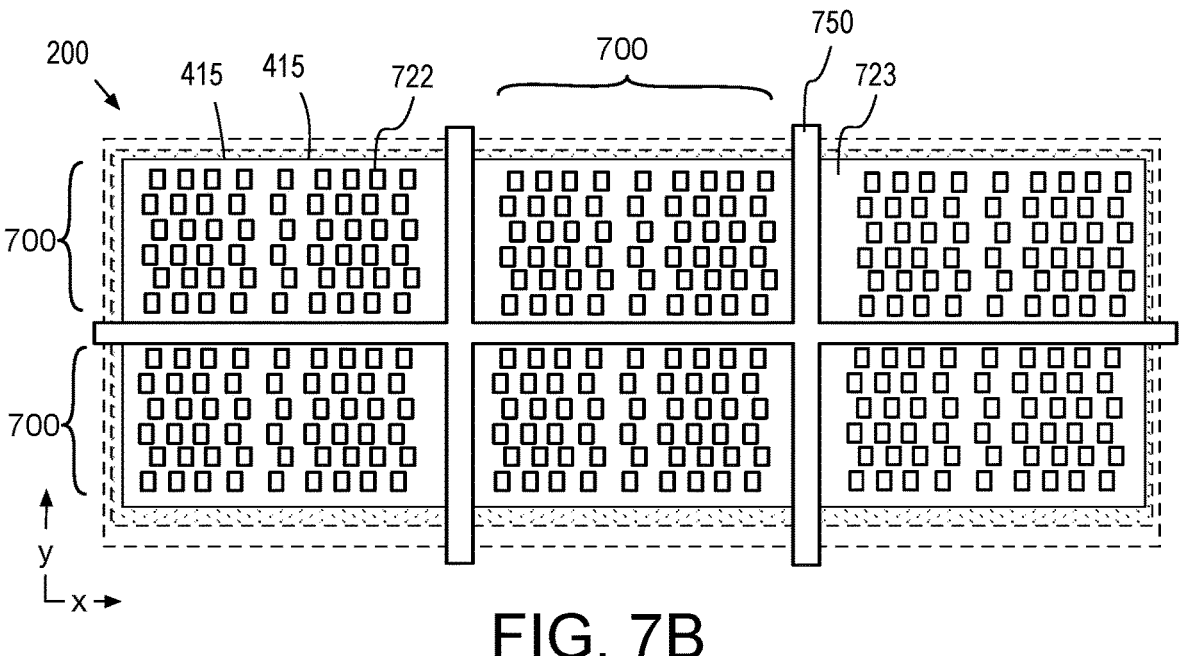
FIG. 7B illustrates a plan view of the workpiece illustrated in FIG. 7A, in accordance with some embodiments.

Returning to FIG. 1, methods 101 end with the completion of the multi-chip device package structures. In accordance with some embodiments, first level interconnects (FLI) may be formed on exposed surfaces of conductive features of the package structures in preparation for packaging or assembly. In exemplary embodiments, solder features are formed as the FLI. The multi-chip device package structures may then be singulated according to any techniques known to be suitable for glass-substrates. In the example illustrated in FIG. 7B, multi-chip device structures 700 are separated by kerf or panel frame 750 with each multi-chip device 700 including two IC dies 415 that are interconnected to each other through bridge interconnects directly formed on a of side of the glass substrate opposite the first-level interconnect interfaces 722.

Figure 8:
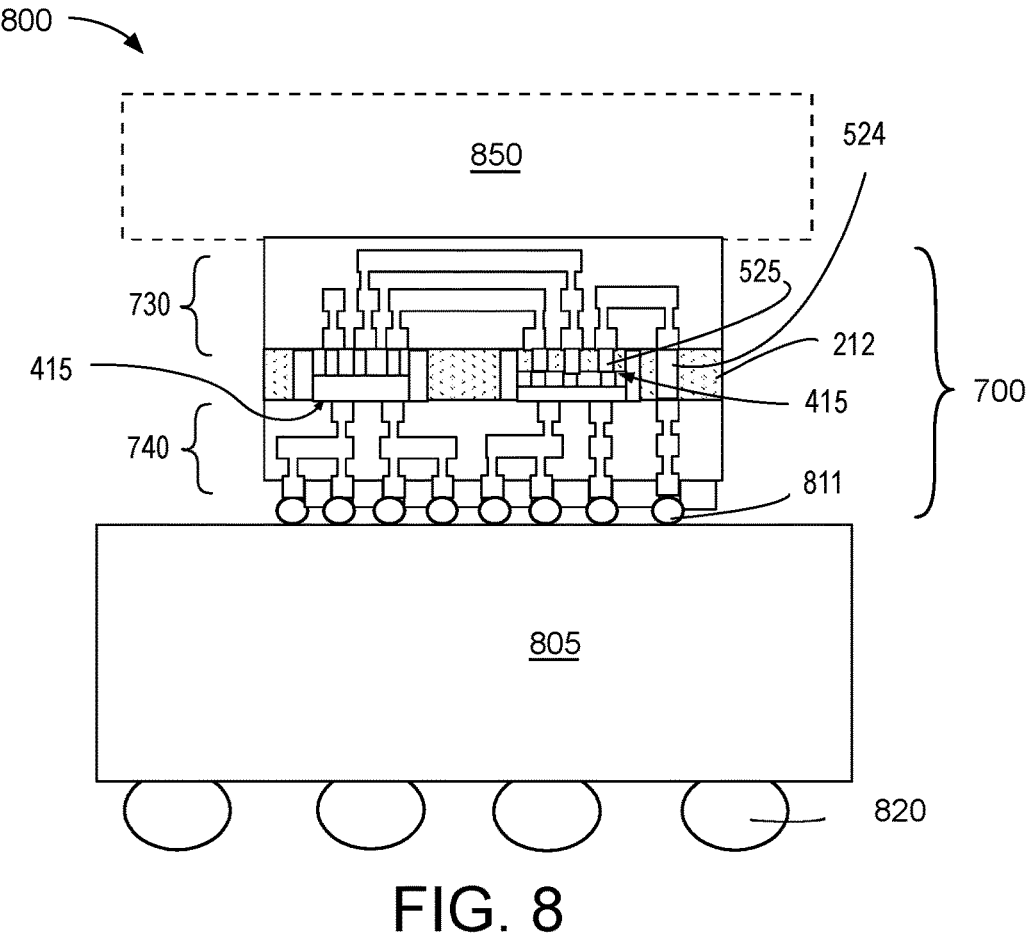
FIG. 8 illustrates a system including one of the multi-chip devices illustrated in FIG. 7 attached to a host component with FLI features, in accordance with some embodiments.

FIG. 8 illustrates a system including multi-chip device structure 700 attached to a host component 805 by reflowing FLI interconnects 811. In exemplary embodiments, FLI interconnects 811 are solder (e.g., SAC) microbumps although other interconnect features are also possible. In some embodiments, host component 805 is predominantly silicon. Host component 805 may also comprise one or more alternative materials known to be suitable as interposers or package substrates (e.g., an epoxy preform, cored or coreless laminate board, etc.). Host component 805 may include one or more metallized redistribution levels (not depicted) embedded within a dielectric material. Host component 805 may also include one or more IC die embedded therein.

In other embodiments, host component 805 includes second level interconnects (SLI) 820. SLI 820 may comprise any solder (ball, bump, etc.) suitable for a given host board architecture (e.g., surface mount FR4, etc.). As illustrated in dashed line, one or more heat spreaders and/or heat sinks 850 may be further coupled to multi-chip device structure 700, which may be advantageous, for example, where IC dies 415 comprise one or more CPU cores or other circuitry of similar power density.

Figure 9:
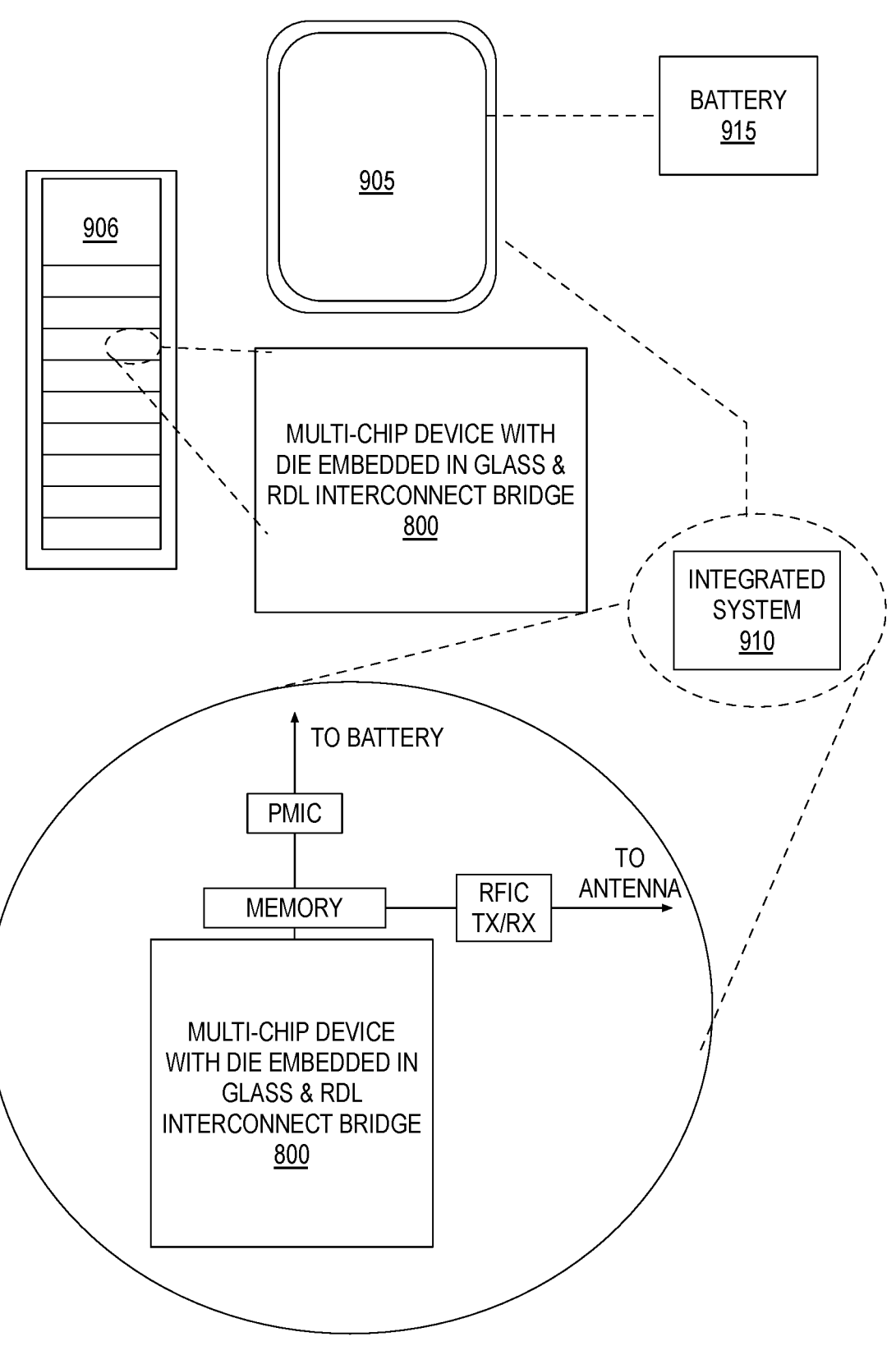
FIG. 9 illustrates a mobile computing platform and a data server machine employing a multi-chip package, in accordance with some embodiments.

FIG. 9 illustrates a mobile computing platform 905 and a data server machine 906 employing a multi-chip IC device with die embedded in a glass substrate and interconnected with redistribution layer metallization features, for example as described elsewhere herein. Server machine 906 may be any commercial server, for example including any number of high-performance computing platforms disposed within a rack and networked together for electronic data processing, which in the exemplary embodiment includes multichip device 800, for example as described elsewhere herein. The mobile computing platform 905 may be any portable device configured for each of electronic data display, electronic data processing, wireless electronic data transmission, or the like. For example, the mobile computing platform 905 may be any of a tablet, a smart phone, laptop computer, etc., and may include a display screen (e.g., a capacitive, inductive, resistive, or optical touchscreen), an integrated system 910, and a battery 915.

As illustrated in the expanded view, multi-chip device 800 is coupled to one or more of a power management integrated circuit (PMIC) or RF (wireless) integrated circuit (RFIC) including a wideband RF (wireless) transmitter and/or receiver. A PMIC may perform battery power regulation, DC-to-DC conversion, etc., and so has an input coupled to battery 815 and with an output providing a current supply to other functional modules. As further illustrated, in the exemplary embodiment, an RFIC has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, and beyond.

Figure 10:
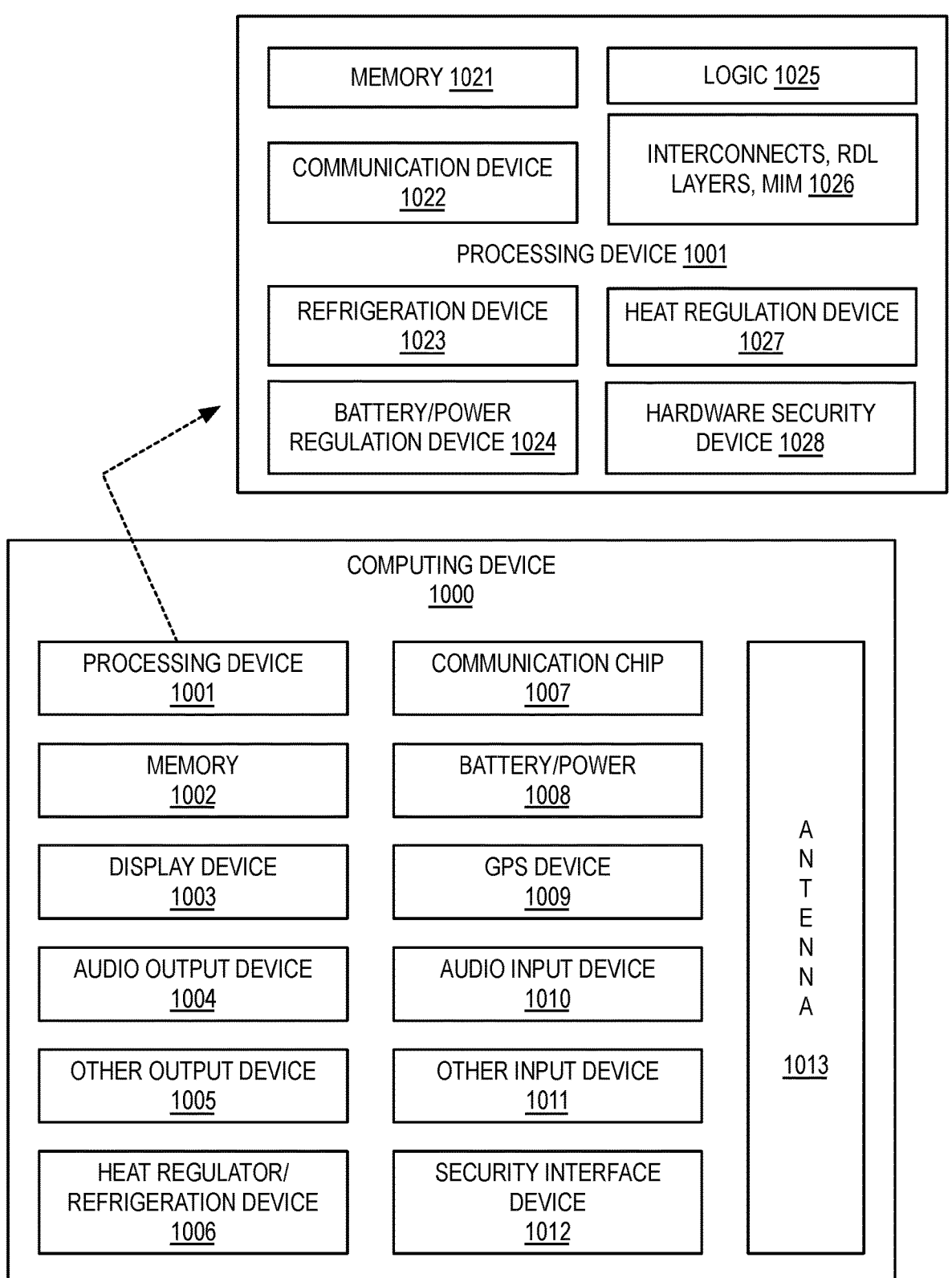
FIG. 10 is a functional block diagram of an electronic computing device, in accordance with some embodiments.

FIG. 10 is a block diagram of a cryogenically cooled computing device 1000 in accordance with some embodiments. For example, one or more components of computing device 1000 may include any of the devices or structures discussed elsewhere herein. A number of components are illustrated in FIG. 10 as included in computing device 1000, but any one or more of these components may be omitted or duplicated, as suitable for the application. In some embodiments, some or all of the components included in computing device 1000 may be attached to one or more printed circuit boards (e.g., a motherboard). In some embodiments, various ones of these components may be fabricated onto a single system-on-a-chip (SoC) die. Additionally, in various embodiments, computing device 1000 may not include one or more of the components illustrated in FIG. 10, but computing device 1000 may include interface circuitry for coupling to the one or more components. For example, computing device 1000 may not include a display device 1003, but may include display device interface circuitry (e.g., a connector and driver circuitry) to which display device 1003 may be coupled.

Computing device 1000 may include a processing device 1001 (e.g., one or more processing devices). As used herein, the term processing device or processor indicates a device that processes electronic data from registers and/or memory to transform that electronic data into other electronic data that may be stored in registers and/or memory. Processing device 1001 may include a memory 1021, a communication device 1022, a refrigeration/active cooling device 1023, a battery/power regulation device 1024, logic 1025, interconnects 1026, a heat regulation device 1027, and a hardware security device 1028.

Processing device 1001 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

Processing device 1001 may include a memory 1002, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, memory 1021 includes memory that shares a die with processing device 1002. This memory may be used as cache memory and may include embedded dynamic random-access memory (eDRAM) or spin transfer torque magnetic random-access memory (STT-M RAM).

Computing device 1000 may include a heat regulation/refrigeration device 1006. Heat regulation/refrigeration device 1006 may maintain processing device 1002 (and/or other components of computing device 1000) at a predetermined low temperature during operation. This predetermined low temperature may be any temperature discussed elsewhere herein.

In some embodiments, computing device 1000 may include a communication chip 1007 (e.g., one or more communication chips). For example, the communication chip 1007 may be configured for managing wireless communications for the transfer of data to and from computing device 1000. The term "wireless" and its derivatives may be used to describe circuits, devices, systems, methods, techniques, communications channels, etc., that may communicate data through the use of modulated electromagnetic radiation through a nonsolid medium.

Communication chip 1007 may implement any wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. Communication chip 1007 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication chip 1007 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 1007 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 1007 may operate in accordance with other wireless protocols in other embodiments. Computing device 1000 may include an antenna 1013 to facilitate wireless communications and/or to receive other wireless communications (such as AM or FM radio transmissions).

In some embodiments, communication chip 1007 may manage wired communications, such as electrical, optical, or any other suitable communication protocols (e.g., the Ethernet). As noted above, communication chip 1007 may include multiple communication chips. For instance, a first communication chip 1007 may be dedicated to shorter-range wireless communications such as Wi-Fi or Bluetooth, and a second communication chip 1007 may be dedicated to longer-range wireless communications such as GPS, EDGE, GPRS, CDMA, WiMAX, LTE, EV-DO, or others. In some embodiments, a first communication chip 1007 may be dedicated to wireless communications, and a second communication chip 1007 may be dedicated to wired communications.

Computing device 1000 may include battery/power circuitry 1008. Battery/power circuitry 1008 may include one or more energy storage devices (e.g., batteries or capacitors) and/or circuitry for coupling components of computing device 1000 to an energy source separate from computing device 1000 (e.g., AC line power).

Computing device 1000 may include a display device 1003 (or corresponding interface circuitry, as discussed above). Display device 1003 may include any visual indicators, such as a heads-up display, a computer monitor, a projector, a touchscreen display, a liquid crystal display (LCD), a light-emitting diode display, or a flat panel display, for example.

Computing device 1000 may include an audio output device 1004 (or corresponding interface circuitry, as discussed above). Audio output device 1004 may include any device that generates an audible indicator, such as speakers, headsets, or earbuds, for example.

Computing device 1000 may include an audio input device 1010 (or corresponding interface circuitry, as discussed above). Audio input device 1010 may include any device that generates a signal representative of a sound, such as microphones, microphone arrays, or digital instruments (e.g., instruments having a musical instrument digital interface (MIDI) output).

Computing device 1000 may include a global positioning system (GPS) device 1009 (or corresponding interface circuitry, as discussed above). GPS device 1009 may be in communication with a satellite-based system and may receive a location of computing device 1000, as known in the art.

Computing device 1000 may include another output device 1005 (or corresponding interface circuitry, as discussed above). Examples include an audio codec, a video codec, a printer, a wired or wireless transmitter for providing information to other devices, or an additional storage device.

Computing device 1000 may include another input device 1011 (or corresponding interface circuitry, as discussed above). Examples may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 1000 may include a security interface device 1012. Security interface device 1012 may include any device that provides security measures for computing device 1000 such as intrusion detection, biometric validation, security encode or decode, managing access lists, malware detection, or spyware detection.

Computing device 1000, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the present disclosure is not limited to the embodiments so described but can be practiced with modification and alteration without departing from the scope of the appended claims. For example, the above embodiments may include specific combinations of features as further provided below.

In a first examples, an integrated circuit (IC) device comprises a first IC die adjacent to a second IC die with a glass substrate therebetween. The device comprises a first routing structure on a first side of the first and second IC dies, the first routing structure comprising first metallization features interconnecting each of the first and second IC dies to first-level package interconnect interfaces. The device comprises a second routing structure on a second side of the first and second IC dies, opposite the first side, the second routing structure comprising second metallization features interconnecting the first IC die to the second IC die.

In second examples, for any of the first examples the device comprises one or more conductive through vias extending through the glass substrate and coupling one of the first metallization features with one of the second metallization features.

In third examples, for any of the first through second examples each of the first and second IC dies further comprises a device layer over a die substrate and one or more conductive vias extending through the die substrate, the conductive vias coupling the device layer to the first or second routing structure.

In fourth examples, for any of the third examples the first routing structure is coupled to the device layer through the conductive vias.

In fifth examples, for any of the third examples the second routing structure is coupled to the device layer through the conductive vias.

In sixth examples, for any of the first through fifth examples a thickness of the glass substrate is substantially equal to a thickness of at least one the first and second IC dies.

In seventh examples, for any of the first through sixth examples each of the first and second metallization features comprise predominantly Cu and the first and second routing structures further comprise a polymer dielectric material surrounding each of the first and second metallization features.

In eighth examples, for any of the seventh examples the polymer dielectric material comprises epoxy, polyimide, or ABF.

In ninth examples, for any of the seventh examples the polymer dielectric material is in direct contact with a first side of the glass substrate, and in direct contact with a second side of the glass substrate, opposite the first side of the glass substrate, and at least some of the first metallization features are in direct contact with the first or second IC die.

In tenth examples, for any of the first through ninth examples the glass substrate is thicker than at least one of the first and second IC dies, and at least one of the first or second routing structure is coupled to at least one of the first or second IC dies by a conductive through glass via.

In eleventh examples, for any of the first through tenth examples the device further comprises first-level interconnect features in contact with the first-level interconnect interfaces. The first-level interconnect features comprise a solder alloy.

In twelfth examples, for any of the eleventh examples the device further comprises a host component electrically coupled to the first-level interconnect interfaces through the first-level interconnect features.

In thirteenth examples, for any of the first through twelfth examples the first routing structure and the second routing structure consist of a same number of metallization levels.

In fourteenth examples, an IC device comprises a plurality of laterally adjacent IC dies with a glass substrate material between edge sidewalls of the IC dies. The IC device comprises a first routing structure on a first side of the IC dies. The first routing structure comprising first metallization features embedded within a polymer dielectric material and interconnecting each of the IC dies to first-level interconnect features. The IC device comprises a second routing structure on a second side of the IC dies. The second routing structure comprising second metallization features embedded within a polymer dielectric material and interconnecting the first IC die to the second IC die.

In fifteenth examples, for any of the fourteenth examples the IC device comprises the first and second metallization features comprise predominantly Cu, and the first routing structure and the second routing structure consist of a same number of metallization levels.

In sixteenth examples, for any of the fourteenth through fifteenth examples the glass substrate material has a thickness substantially equal to a thickest one of the plurality of IC dies and thicker than a thinnest one of the plurality of IC dies, and at least one of the first or second routing structure is coupled to the thinnest of the IC dies by a conductive through glass via.

In seventeenth examples, for any of the thirteenth through sixteenth examples the system comprises a host component interconnected to the first routing structure through first-level interconnects coupled to the first-level interconnect features.

In eighteenth examples, a method of fabricating an integrated circuit (IC) device comprises placing a first IC die and a second IC die within one or more recesses in a glass substrate, building up an organic dielectric material on opposite sides of the first and second IC dies and the glass substrate, building up first and second interconnect features with the organic dielectric material on opposite sides of the first and second IC dies and the glass substrate, wherein the first interconnect features electrically couple the first and second IC die to first level interconnect interfaces and wherein the second interconnect features electrical couple the first IC die to the second IC die.

In nineteenth examples, for any of the eighteenth examples the method comprises forming a conductive through via through a portion of the glass substrate adjacent to at least one of the first or second IC dies, and planarizing a surface of the glass substrate with at least one of the conductive through via, first IC die or second IC die.

In twentieth examples, for any of the eighteenth through nineteenth examples building up the organic dielectric material comprises a dry film lamination or spin-on application process.

However, the above embodiments are not limited in this regard, and, in various implementations, the above embodiments may include the undertaking of only a subset of such features, undertaking a different order of such features, undertaking a different combination of such features, and/or undertaking additional features than those features explicitly listed. The scope of the present disclosure should therefore be determined with reference to the appended claims, along with the full scope of equivalents to which such claims are entitled.

What is claimed is:

1. An integrated circuit (IC) device, comprising:
a first IC die adjacent to a second IC die with a glass substrate therebetween, wherein each of the first and second IC dies further comprises a device layer over a die substrate and a plurality of conductive vias extending through the die substrate;
a first package routing structure on a first side of the first and second IC dies, the first package routing structure comprising a plurality of first metallization lines interconnecting each of the first and second IC dies to first-level package interconnect interfaces; and
a second package routing structure on a second side of the first and second IC dies, opposite the first side, the second package routing structure comprising a plurality of levels of second metallization lines electrically interconnecting the plurality of conductive vias of the first IC die to corresponding ones of the plurality of conductive vias of the second IC die.

2. The IC device of claim 1, further comprising one or more conductive through vias extending through the glass substrate and coupling one of the first metallization lines with one of the second metallization lines.

3. The IC device of claim 1, wherein each of the first and second metallization lines comprise predominantly Cu and the first and second package routing structures further comprise a polymer dielectric material surrounding each of the first and second metallization lines.

4. The IC device of claim 3, wherein the polymer dielectric material comprises epoxy, polyimide, or ABF.

5. The IC device of claim 3, wherein:
the polymer dielectric material is in direct contact with a first side of the glass substrate, and in direct contact with a second side of the glass substrate, opposite the first side of the glass substrate; and
the first package routing structure is in direct contact with the first or second IC die.

6. The IC device of claim 1, wherein the glass substrate is thicker than at least one of the first and second IC dies, and at least one of the first or second package routing structure is coupled to at least one of the first or second IC dies by a conductive through glass via.

7. The IC device of claim 1, further comprising first-level interconnect features in contact with the first-level interconnect interfaces, wherein the first-level interconnect features comprise a solder alloy.

8. The IC device of claim 7, further comprising a host component electrically coupled to the first-level interconnect interfaces through the first-level interconnect features.

9. The IC device of claim 1, wherein the first package routing structure and the second package routing structure consist of a same number of metallization levels.

10. The IC device of claim 1, wherein at least one of the levels of the second metallization lines comprises lines and spaces of less than 3 μm.

11. A system comprising:
a plurality of laterally adjacent IC dies with a glass substrate material between edge sidewalls of the IC dies, wherein each of the IC dies further comprises a device layer over a die substrate and a plurality of conductive vias extending through the die substrate;
a first routing structure on a first side of the IC dies, the first routing structure comprising a plurality of first metallization lines embedded within a polymer dielectric material and interconnecting each of the IC dies to first-level interconnect features that are over the first side of the IC dies with the first routing structure therebetween; and a second routing structure on a second side of the IC dies, the second routing structure comprising a plurality of levels of second metallization lines embedded within a polymer dielectric material and electrically interconnecting the plurality of conductive vias of a first of the IC dies to corresponding ones of the plurality of conductive vias of a second of the IC dies.

12. The system of claim 11, wherein:

the first and second metallization lines comprise predominantly Cu; and the first routing structure and the second routing structure consist of a same number of metallization levels.

13. The system of claim 11, wherein:

the glass substrate material has a thickness substantially equal to a thickest one of the plurality of IC dies and thicker than a thinnest one of the plurality of IC dies; and at least one of the first or second routing structure is coupled to the thinnest of the IC dies by a conductive through glass via.

14. The system of claim 11, further comprising:

a host component interconnected to the first routing structure through first-level interconnects coupled to the first-level interconnect features.

15. The system of claim 11, wherein at least one of the levels of the second metallization lines comprises lines and spaces of less than 3 μm.

16. A method of fabricating an integrated circuit (IC) device, the method comprising:

placing a first IC die and a second IC die within one or more recesses in a glass substrate, wherein each of the IC dies further comprises a device layer over a die substrate and a plurality of conductive vias extending through the die substrate;

building up an organic dielectric material on opposite sides of the first and second IC dies and the glass substrate;

building up a plurality of levels of first and second interconnect lines within the organic dielectric material on opposite sides of the first and second IC dies and the glass substrate, wherein the plurality of levels of first interconnect lines are to electrically couple the first and second IC die to first level interconnect interfaces and wherein the plurality of levels of second interconnect lines electrically bridge the plurality of conductive vias of the first IC die to corresponding ones of the plurality of conductive vias of the second IC die.

17. The method of claim 16, further comprising:

forming a conductive through via through a portion of the glass substrate adjacent to at least one of the first or second IC dies; and planarizing a surface of the glass substrate with at least one of the conductive through vias, first IC die or second IC die.

18. The method of claim 16, wherein building up the organic dielectric material comprises a dry film lamination or spin-on application process.

19. The method of claim 16, wherein at least one of the pluralit of levels of the second interconnect lines comprises lines and spaces of less than 3 μm.

* * * * *